United States Patent
Budge et al.

(10) Patent No.: US 6,503,851 B2
(45) Date of Patent: Jan. 7, 2003

(54) USE OF LINEAR INJECTORS TO DEPOSIT UNIFORM SELECTIVE OZONE TEOS OXIDE FILM BY PULSING REACTANTS ON AND OFF

(75) Inventors: William Budge, Homedale, ID (US); Gurtej S. Sandhu, Boise, ID (US); Christopher W. Hill, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/921,539

(22) Filed: Aug. 3, 2001

(65) Prior Publication Data

US 2002/0025692 A1 Feb. 28, 2002

Related U.S. Application Data

(63) Continuation-in-part of application No. 09/652,188, filed on Aug. 31, 2000, now Pat. No. 6,368,986.

(51) Int. Cl.⁷ ........................ H01L 21/31; H01L 21/469
(52) U.S. Cl. ........................................... 438/787
(58) Field of Search ................................ 438/787

(56) References Cited

U.S. PATENT DOCUMENTS

| | | | |
|---|---|---|---|
| 4,470,852 A | 9/1984 | Ellsworth | 148/1.5 |
| 4,717,678 A | 1/1988 | Goth | 437/27 |
| 5,399,513 A | 3/1995 | Liou et al. | 437/34 |
| 5,665,644 A | 9/1997 | Sandhu | 438/641 |
| 5,855,957 A | 1/1999 | Yuan | 427/255.3 |
| 5,882,993 A | 3/1999 | Gardner et al. | 438/591 |
| 6,050,506 A | 4/2000 | Guo et al. | 239/558 |
| 6,090,693 A | 7/2000 | Gonzalez et al. | 438/592 |
| 6,149,974 A | 11/2000 | Nguyen et al. | 427/255.29 |
| 6,387,764 B1 * | 5/2002 | Curtis et al. | 438/296 |

FOREIGN PATENT DOCUMENTS

JP    406283526 A    10/1994    ....... H01L/21/3205

* cited by examiner

*Primary Examiner*—Richard Elms
*Assistant Examiner*—Beth E. Owens
(74) *Attorney, Agent, or Firm*—Whyte Hirschboeck Dudek SC

(57) ABSTRACT

A process for enhanced selective deposition of a silicon oxide onto a substrate by pulsing delivery of the reactants through a linear injector is disclosed. The silicon oxide layer is formed by the ozone decomposition of TEOS at relatively low temperatures and relatively high pressures. The ozone delivery is pulsed on and off. Optionally, the delivery of the ozone and the delivery of the TEOS are pulsed on and off alternately.

56 Claims, 2 Drawing Sheets

USE OF LINEAR INJECTORS TO DEPOSIT UNIFORM SELECTIVE OZONE TEOS OXIDE FILM BY PULSING REACTANTS ON AND OFF

This is a continuation-in-part of U.S. patent application Ser. No. 09/652,188 filed Aug. 31, 2000 now U.S. Pat. No. 6,368,986 issued Apr. 9, 2002.

FIELD OF THE INVENTION

This invention relates to the fabrication of semiconductor devices. More particularly, this invention relates to selective deposition of silicon oxide onto silicon substrates.

BACKGROUND OF THE INVENTION

Optimization of semiconductor fabrication sometimes requires a thicker nonconducting film on some components than on other components. Such films of different thicknesses can be made by traditional mask and etch techniques or by selective deposition of the reaction product of TEOS and ozone.

Traditional mask and etch methods of forming oxide layers and spacers of different thicknesses requires the application of a first mask over select parts of the semiconductor device and then depositing a layer of silicon oxide over the unmasked parts of the semiconductor device. The first mask is then removed and a second mask is applied over the parts that have been coated with the first silicon oxide layer leaving other parts unmasked. Subsequently, a second silicon oxide layer is deposited on the unmasked parts. Finally, an etch is used to remove silicon oxide from select surfaces, leaving behind an oxide layer or spacers where desired. This process adds a number of steps to the manufacturing procedures thereby increasing the complexity of the fabrication. As such, semiconductors are typically manufactured oxide with oxide layers or spacers of an intermediate thickness that will work acceptably, although not optimally, for substrates of different conductivity or composition.

The selective deposition of TEOS/ozone on silicon in preference to silicon nitride has been disclosed in the prior art. Copending U.S. patent application Ser. No. 09/652,188 filed Aug. 31, 2000 discloses selective deposition of TEOS/ozone wherein the selectivity is based on differences in the doping of silicon. In situations where these selective deposition techniques are usable they provide means to form different thickness oxide layers in one step, thereby saving process time. The current invention improves upon the selectivity of these methods.

A hallmark of the current invention is the provision of a process that selectively deposits silicon oxide based on the characteristics of the underlying substrate and pulsed delivery of the reactants.

SUMMARY OF THE INVENTION

The current invention is a method for enhancing selective depositing silicon oxide onto a substrate surface, wherein the selectivity is based on the conductivity and/or the composition of the substrate, by pulsing the delivery of the reactants.

One preferred embodiment is a method for selectively depositing silicon oxide onto a substrate, the method comprising the steps of: providing a substrate having at least one exposed region of silicon and at least one exposed region of silicon nitride and/or comprising at least one exposed silicon region of one type of conductivity and at least one exposed silicon region of a different type conductivity; delivering, via a linear injector, ozone and tetraethylorthosilicate into contact with the substrate and with each other, wherein the delivery of the ozone is pulsed on and off; and reacting the ozone and tetraethylorthosilicate in contact with the substrate to selectively deposit silicon oxide onto the substrate.

Another preferred embodiment is a method for selectively depositing silicon oxide onto a substrate, the method comprising the steps of: providing a substrate having at least one exposed region of silicon and at least one exposed region of silicon nitride and/or comprising at least one exposed silicon region of one type of conductivity and at least one exposed silicon region of a different type conductivity; delivering, via a linear injector, ozone and tetraethylorthosilicate into contact with the substrate and with each other, wherein the delivery of the ozone is pulsed on and off; and reacting the ozone and tetraethylorthosilicate in contact with the substrate to selectively deposit silicon oxide onto the substrate, wherein the reaction occurs at a temperature up to about 500° C. and a pressure of at least about 10 torr.

A further preferred embodiment is a method for selectively depositing silicon oxide onto a substrate, the method comprising the steps of: providing a substrate having at least one exposed region of silicon and at least one exposed region of silicon nitride and/or comprising at least one exposed silicon region of one type of conductivity and at least one exposed silicon region of a different type conductivity; delivering, via a linear injector, ozone and tetraethylorthosilicate into contact with the substrate and with each other, wherein the delivery of the ozone and the delivery of the tetraethylorthosilicate are pulsed on and off alternately; and reacting the ozone and tetraethylorthosilicate in contact with the substrate to selectively deposit silicon oxide onto the substrate.

Still another preferred embodiment is a method for selectively depositing silicon oxide onto a substrate, the method comprising the steps of: providing a substrate having at least one exposed region of silicon and at least one exposed region of silicon nitride and/or comprising at least one exposed silicon region of one type of conductivity and at least one exposed silicon region of a different type conductivity; delivering, via a linear injector, ozone and tetraethylorthosilicate into contact with the substrate and with each other, wherein the delivery of the ozone and the delivery of the tetraethylorthosilicate are pulsed on and off alternately; and reacting the ozone and tetraethylorthosilicate in contact with the substrate to selectively deposit silicon oxide onto the substrate, wherein the reaction occurs at a temperature up to about 500° C. and a pressure of at least about 10 torr.

A further preferred embodiment is a semiconductor processing method of forming spacers of variable thickness, the method comprising the steps of: providing a silicon-comprising substrate having a surface comprising at least one first conductive region comprising either P-type silicon or non-doped silicon and at least one second conductive region, provided that: (1) when the first conductive region comprises P-type silicon, then the second conductive region comprises either non-doped silicon or N-type silicon; and, (2) when the first conductive region comprises non-doped silicon, then the second conductive region comprises N-type silicon; decomposing tetraethylorthosilicate with ozone to selectively deposit silicon oxide over the silicon surface and over both the first conductive region and the second conductive region, wherein delivery of the ozone is pulsed on and off whereby a greater thickness of silicon oxide is deposited on the first conductive region than on the second conductive region and delivery of the ozone and the tetraethylorthosilicate is via a linear injector; and, etching the silicon oxide deposited on the substrate to remove silicon oxide from the surface of the substrate, whereby the silicon oxide layers remaining on the first and second conductive regions provides a layer of variable thickness around the first conductive region and the second conductive region.

Another preferred embodiment is a semiconductor processing method of forming spacers of variable thickness, the process comprising the steps of: providing a silicon-comprising substrate having a surface comprising at least one first conductive region comprising either P-type silicon or non-doped silicon and at least one second conductive region, provided that: (1) when the first conductive region comprises P-type silicon, then the second conductive region comprises either non-doped silicon or N-type silicon; and, (2) when the first conductive region comprises non-doped silicon, then the second conductive region comprises N-type silicon; contacting silicon-comprising substrate with ozone and tetraethylorthosilicate wherein delivery of the ozone is pulsed on and off whereby the first conductive region and the second conductive region are in intimate contact with the ozone and the tetraethylorthosilicate and delivery of the ozone and the tetraethylorthosilicate is via a linear injector; reacting the ozone and the tetraethylorthosilicate at a temperature up to about 500° C. and a pressure of at least about 10 torr to selectively deposit silicon oxide over the substrate surface and both the first conductive region and the second conductive region, whereby a greater thickness of silicon oxide is deposited on the first conductive region than on the second conductive region; and, etching the silicon oxide deposited on the substrate to remove silicon oxide from the surface of the substrate, whereby the silicon oxide layers remaining on the first and second conductive regions provides a layer of variable thickness around the first conductive region and the second conductive region.

Yet another preferred embodiment is a semiconductor processing method of forming spacers of variable thickness, the method comprising the steps of: providing a silicon-comprising substrate having a surface comprising at least one first protrusion comprising either P-type silicon or non-doped silicon and at least one second protrusion, provided that: (1) when the first protrusion comprises P-type silicon then the second protrusion comprises either non-doped silicon or N-type silicon; and, (2) when the first protrusion comprises non-doped silicon then the second protrusion comprises N-type silicon; contacting the wafer surface with ozone and tetraethylorthosilicate wherein delivery of the ozone is pulsed on and off, and delivery of the ozone and the tetraethylorthosilicate is via a linear injector, whereby the first protrusion and the second protrusion are in intimate contact with the ozone and the tetraethylorthosilicate; decomposing the tetraethylorthosilicate with the ozone to selectively deposit silicon oxide over the wafer surface and both the first protrusion and the second protrusion, whereby a greater thickness of silicon oxide is deposited on the first protrusion than on the second protrusion; and, etching the silicon oxide deposited on the substrate to remove silicon oxide from the surface of the substrate, whereby the silicon oxide layers remaining on the first and second protrusions provides a layer of variable thickness around the first protrusion and the second protrusion.

Another preferred embodiment is a semiconductor processing method of forming spacers of variable thickness, the process comprising the steps of: providing a silicon-comprising substrate having a surface comprising at least one first protrusion comprising either P-type silicon or non-doped silicon and at least one second protrusion, provided that: (1) when the first protrusion comprises P-type silicon, then the second protrusion comprises either non-doped silicon or N-type silicon; and, (2) when the first protrusion comprises non-doped silicon, then the second protrusion comprises N-type silicon; reacting ozone and TEOS at a temperature up to about 500° C. and a pressure of at least about 10 torr wherein delivery of the ozone is pulsed on and off, and delivery of the ozone and the tetraethylorthosilicate is via a linear injector, to selectively deposit silicon oxide over the wafer surface and both the first protrusion and the second protrusion, whereby a greater thickness of silicon oxide is deposited on the first protrusion than on the second protrusion; and, etching the silicon oxide deposited on the substrate to remove silicon oxide from the surface of the substrate, whereby the silicon oxide layers remaining on the first and second protrusions provides a layer of variable thickness around the first protrusion and the second protrusion.

A further preferred embodiment is a semiconductor processing method of forming wordlines with spacers of variable thickness, the process comprising the steps of: providing a silicon-comprising substrate having a surface comprising at least one first wordline comprising P-type silicon and at least one second wordline comprising N-type silicon: reacting ozone and tetraethylorthosilicate at a temperature up to about 500° C. and a pressure of at least about 10 torr wherein delivery of the ozone is pulsed on and off, and the ozone and the tetraethylorthosilicate are delivered via a linear injector, to selectively deposit silicon oxide over the wafer surface and both the first wordline and the second wordline, whereby a greater thickness of silicon oxide is deposited on the first wordline than on the second wordline; and, etching the silicon oxide deposited on the substrate to remove silicon oxide from the surface of the substrate, whereby the silicon oxide layers remaining on the first and second wordlines provides a layer of variable thickness around the first wordline and the second wordline.

A preferred embodiment is a semiconductor processing method of forming spacers of variable thickness, the method comprising the steps of: providing a silicon-comprising substrate having a surface comprising at least one first conductive region comprising either P-type silicon or non-doped silicon and at least one second conductive region, provided that: (1) when the first conductive region comprises P-type silicon, then the second conductive region comprises either non-doped silicon or N-type silicon; and, (2) when the first conductive region comprises non-doped silicon, then the second conductive region comprises N-type silicon; decomposing tetraethylorthosilicate with ozone to selectively deposit silicon oxide over the silicon surface and over both the first conductive region and the second conductive region, wherein delivery of the ozone and the tetraethylorthosilicate are alternately pulsed on and off, whereby a greater thickness of silicon oxide is deposited on the first conductive region than on the second conductive region and delivery of the ozone and the tetraethylorthosilicate is via a linear injector; and, etching the silicon oxide deposited on the substrate to remove silicon oxide from the surface of the substrate, whereby the silicon oxide layers remaining on the first and second conductive regions provides a layer of variable thickness around the first conductive region and the second conductive region.

Another preferred embodiment is a semiconductor processing method of forming spacers of variable thickness, the process comprising the steps of: providing a silicon-comprising substrate having a surface comprising at least one first conductive region comprising either P-type silicon or non-doped silicon and at least one second conductive region, provided that: (1) when the first conductive region comprises P-type silicon, then the second conductive region comprises either non-doped silicon or N-type silicon; and, (2) when the first conductive region comprises non-doped silicon, then the second conductive region comprises N-type silicon; contacting silicon-comprising substrate with ozone and tetraethylorthosilicate wherein the ozone delivery and the tetraethylorthosilicate are alternately pulsed on and off whereby the first conductive region and the second conductive region are in intimate contact with the ozone and the tetraethylorthosilicate and the delivery of the ozone and the tetraethylorthosilicate is via a linear injector; reacting the ozone and the tetraethylorthosilicate at a temperature up to about 500° C. and a pressure of at least about 10 torr to selectively deposit silicon oxide over the substrate surface and both the first conductive region and the second conductive region, whereby a greater thickness of silicon oxide is deposited on the first conductive region than on the second conductive region; and, etching the silicon oxide deposited on the substrate to remove silicon oxide from the surface of the substrate, whereby the silicon oxide layers remaining on the first and second conductive regions provides a layer of variable thickness around the first conductive region and the second conductive region.

Still another preferred embodiment is a semiconductor processing method of forming spacers of variable thickness, the method comprising the steps of: providing a silicon-comprising substrate having a surface comprising at least one first protrusion comprising either P-type silicon or non-doped silicon and at least one second protrusion, provided that: (1) when the first protrusion comprises P-type silicon then the second protrusion comprises either non-doped silicon or N-type silicon; and, (2) when the first protrusion comprises non-doped silicon then the second protrusion comprises N-type silicon; contacting the wafer surface with ozone and tetraethylorthosilicate wherein delivery of the ozone and the tetraethylorthosilicate are alternately pulsed on and off, and the delivery of the ozone and the tetraethylorthosilicate is via a linear injector, whereby the first protrusion and the second protrusion are in intimate contact with the ozone and the tetraethylorthosilicate; decomposing the tetraethylorthosilicate with the ozone to selectively deposit silicon oxide over the wafer surface and both the first protrusion and the second protrusion, whereby a greater thickness of silicon oxide is deposited on the first protrusion than on the second protrusion; and, etching the silicon oxide deposited on the substrate to remove silicon oxide from the surface of the substrate, whereby the silicon oxide layers remaining on the first and second protrusions provides a layer of variable thickness around the first protrusion and the second protrusion.

Yet another preferred embodiment is a semiconductor processing method of forming spacers of variable thickness, the process comprising the steps of: providing a silicon-comprising substrate having a surface comprising at least one first protrusion comprising either P-type silicon or non-doped silicon and at least one second protrusion, provided that: (1) when the first protrusion comprises P-type silicon, then the second protrusion comprises either non-doped silicon or N-type silicon; and, (2) when the first protrusion comprises non-doped silicon, then the second protrusion comprises N-type silicon; reacting ozone and TEOS at a temperature up to about 500° C. and a pressure of at least about 10 torr wherein delivery of the ozone and the tetraethylorthosilicate are alternately pulsed on and off, and delivery of the ozone and the tetraethylorthosilicate is via a linear injector, to selectively deposit silicon oxide over the wafer surface and both the first protrusion and the second protrusion, whereby a greater thickness of silicon oxide is deposited on the first protrusion than on the second protrusion; and, etching the silicon oxide deposited on the substrate to remove silicon oxide from the surface of the substrate, whereby the silicon oxide layers remaining on the first and second protrusions provides a layer of variable thickness around the first protrusion and the second protrusion.

Another preferred embodiment is a semiconductor processing method of forming wordlines with spacers of variable thickness, the process comprising the steps of: providing a silicon-comprising substrate having a surface comprising at least one first wordline comprising P-type silicon and at least one second wordline comprising N-type silicon: reacting ozone and tetraethylorthosilicate at a temperature up to about 500° C. and a pressure of at least about 10 torr wherein delivery of the ozone and the tetraethylorthosilicate are alternately pulsed on and off, and the ozone and the tetraethylorthosilicate are delivered via a linear injector, to selectively deposit silicon oxide over the wafer surface and both the first wordline and the second wordline, whereby a greater thickness of silicon oxide is deposited on the first wordline than on the second wordline; and, etching the silicon oxide deposited on the substrate to remove silicon oxide from the surface of the substrate, whereby the silicon oxide layers remaining on the first and second wordlines provides a layer of variable thickness around the first wordline and the second wordline.

BRIEF DESCRIPTION OF THE DRAWINGS

Preferred embodiments of the invention are described below with reference to the following accompanying drawings, which are for illustrative purposes only. Throughout the following views, reference numerals will be used in the drawings, and the same reference numerals will be used throughout the several views and in the description to indicate same or like parts.

DETAILED DESCRIPTION

In the following detailed description, references are made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention.

The terms "wafer" or "substrate" used in the following description include any semiconductor-based structure having an exposed polysilicon or other silicon-comprising surface in which to form the silicon oxide deposition layer of this invention. Wafer and substrate are to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when references made to a wafer or substrate in the following description, previous process steps may have been used to form regions or junctions in the base semiconductor structure or foundation.

Figure 1:
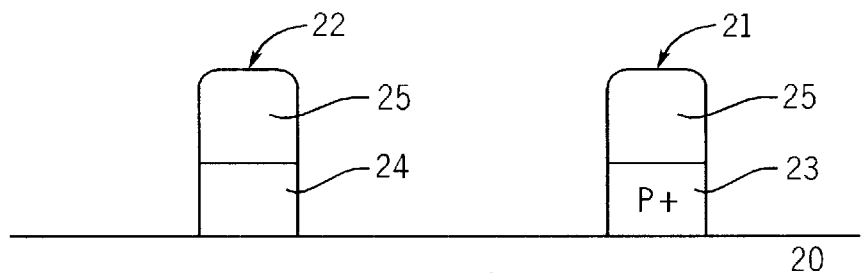
FIG. 1 is a cross-sectional view of a silicon-comprising substrate having an N-type silicon-comprising protrusion and a P-type silicon-comprising protrusion.
Figure 2:
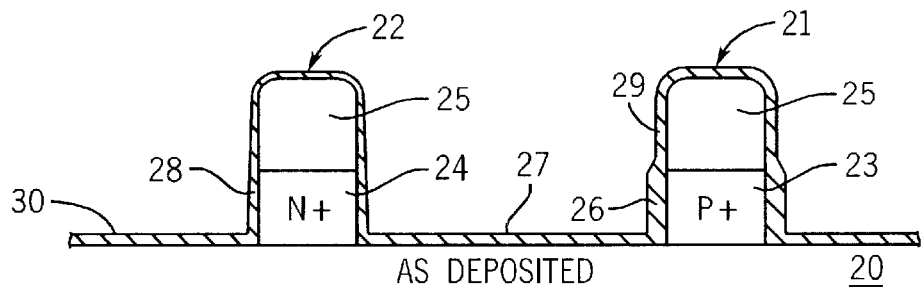
FIG. 2 shows the substrate of FIG. 1 following selective depositing of silicon oxide.
Figure 3:
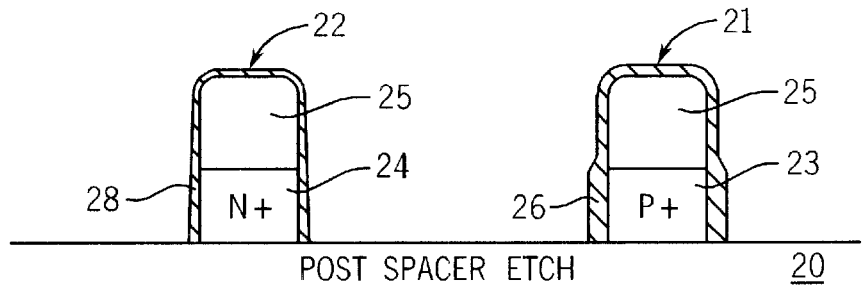
FIG. 3 shows the substrate of FIG. 2 following an etch processing step.

The following discussion based on FIGS. 1–3 illustrates a typical selective deposition process which can be enhanced by application of the current inventive process. The exemplary selective deposition process is shown as occurring on a substrate of differently doped areas of silicon but the process would be the same if the substrate comprised silicon and silicon nitride.

FIG. 1 shows a typical embodiment of the process of this invention, in which two non-abutting structures or protrusions 21, 22 are arrayed on a silicon-comprising substrate 20 such as single crystal silicon, epitaxial silicon or polysilicon. Protrusion 21 has a P-type doped silicon layer 23. Protrusion 22 has an N-type doped silicon layer 24. Protrusions 21 and 22 each have a metalized film 25, such as tungsten silicide, arrayed atop the doped polysilicon layers 23 and 24, respectively.

The substrate 20 (single crystal) and protrusions 21 and 22 are contacted with gaseous ozone and gaseous TEOS under conditions where a silicon oxide layer 30 is deposited over the substrate and protrusions as shown in FIG. 2. At the proper reaction conditions, the silicon oxide will deposit selectively onto the substrate and protrusions in a single process step. The selectivity of this single process step avoids the necessity of masking and performing multiple photolithographic steps to form a suitably thick oxide layer or spacer 30 over the component layers of the protrusions 21, 22 and the substrate 20. As shown a thicker layer 26 is formed over the P-type layer 23. An intermediate thickness layer 27 is deposited over non-doped silicon substrate 20. A thinner layer 24 is deposited over the N-type silicon layer 24. An intermediate thickness layer 29 is deposited over metalized silicide film layer 25.

Appropriate reaction conditions for the selective deposition of silicon oxide over materials with different type doping is similar to the reaction conditions used in conventional methods to obtain selective deposition on silicon versus silicon nitride. Such reaction conditions are known in the art as shown in U.S. Pat. No. 5,665,644, incorporated herein by reference. Typically, the reaction temperature is greater than about 200° C. up to about 500° C., preferably up to about 400° C. Generally, the selectivity of the deposition is more pronounced at lower reaction temperatures. The reaction pressure is at least about 10 torr, preferably at least about 300 torr up to about atmospheric pressure, more preferably up to about 600 torr.

An exemplary reaction supplies about five liters per minute of oxygen containing about 10% by weight ozone and about 350 milligrams per minute TEOS. The oxygen:ozone ratio may typically vary from about 2 parts oxygen: 1 part ozone to about 20 parts oxygen: 1 part ozone. The ozone: TEOS ratio typically varies from about 0.5:1 to about 200:1. Reaction times will vary depending on the desired thickness of the deposited layer, generally about 10–30 seconds.

Optionally, the surface to receive the oxide layer may be wet cleaned in a dip prior to depositing the oxide layer. A hydrofluoric acid (HF) wet-clean dip provides a marginal enhancement of the selectivity of the deposition. Other wet-clean dips, such as sulfuric acid or non-fluorine type etchants, have not been found to enhance the selectivity of the deposition and may negatively affect the subsequent deposition.

Following the deposition of the oxide layer 30, the portion of the oxide layer 27 overlying the substrate 20 is selectively etched to expose the substrate 20, resulting in the structure of FIG. 3 having the oxide layers 26, 28 remaining over the protrusions 21, 22, respectively. Any suitable oxide etching method may be used to remove the oxide layer 27 and expose the substrate 20. Preferably, the method provides an anisotropic etch. Suitable etching methods include directional methods such as reactive ion etching (RIE). An exemplary etching process is by RIE using a mixture of carbon tetrafluoride ($CF_4$) at a flow of about 15 standard cubic centimeters per minute (sccm), and methylene trifluoride ($CHF_3$) at 25 sccm for thirty seconds at about 200 millitorr and a power of 100 watts.

In one preferred embodiment, the protrusions 21, 22 of FIG. 1 represent wordlines of different conductivity. In this embodiment, layer 23 represents a wordline comprising P-doped 20 silicon and layer 24 represents a wordline comprising N-doped silicon. These wordlines can be incorporated into a memory unit, such as a dynamic random access memory (DRAM), by any suitable means known in the art.

In another preferred embodiment of the invention, the protrusions 21, 22 represent a dual gate structure. In this embodiment, layer 23 in FIG. 1 represents a gate comprising P-doped silicon and layer 24 represents a gate comprising N-doped polysilicon.

The inventors have now found that the selectivity of the deposition process described above can be enhanced by pulsing the delivery of the reactants. Appropriate reaction conditions for the pulsed selective deposition of silicon oxide are similar to the non-pulsed methods to obtain selective deposition as discussed above in reference to FIGS. 1–3. Such reaction conditions are known in the art as shown in U.S. Pat. No. 5,665,644, incorporated herein by reference. Typically, the reaction temperature is greater than about 200° C. up to about 500° C., preferably up to about 400° C. Generally, the selectivity of the deposition is more pronounced at lower reaction temperatures. The reaction pressure is at least about 10 torr, preferably at least about 300 torr up to about atmospheric pressure, more preferably up to about 600 torr.

An exemplary reaction supplies at least the following two ingredients: (i) about five liters per minute of oxygen containing about 10% by weight ozone; and, (ii) about 350 milligrams per minute TEOS. The oxygen:ozone ratio may typically vary from about 2 parts oxygen: 1 part ozone to about 20 parts oxygen: 1 part ozone. The ozone: TEOS ratio typically varies from about 0.5:1 to about 200:1. Reaction times will vary depending on the desired thickness of the deposited layer, generally about 10–30 seconds.

In a preferred embodiment wherein the TEOS delivery rate is held constant, the ozone delivery is be pulsed on and off with a pulse duration of about 1 to about 4 seconds, preferably about 1 second.

In another preferred embodiment the TEOS and the ozone delivery rates are both alternately pulsed on and off for a pulse duration of about 1 to about 4 seconds, preferably about 2 seconds.

The delivery of the gases may be pulsed by any suitable means of starting and stopping flow. Such means are well known in the art and can include, inter alia, solenoid valves. Although the reactant gases may be delivered via any suitable injector, a linear injector is preferred over a showerhead injector on the basis of superior uniformity of the oxide layer thickness. Linear injectors and showerhead injectors are known in the art. An example of a linear injector suitable for use in this invention is disclosed in U.S. Pat. No. 5,855,957 which is incorporated herein by reference. An example of a typical showerhead injector is disclosed in U.S. Pat. No. 6,050,506 which is incorporated herein by reference.

Figure 4:
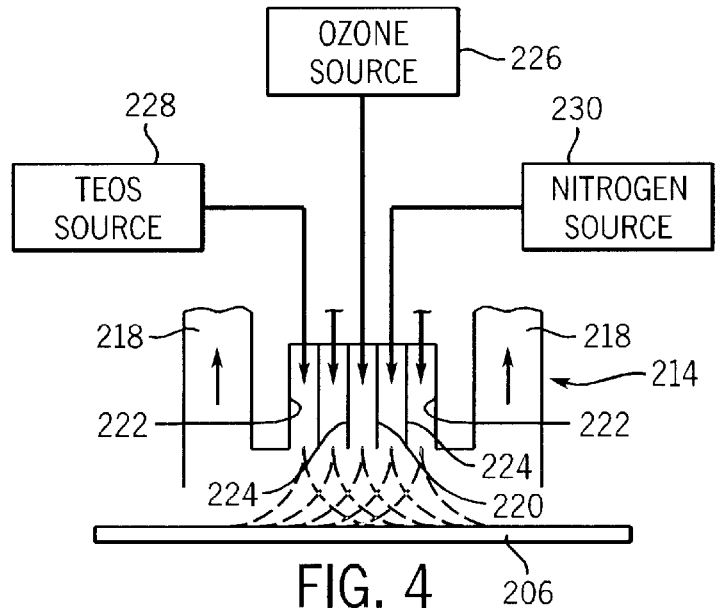
FIG. 4 shows a schematic drawing of a linear injector usable in the current invention.

A linear injection system usable for this invention is shown schematically in FIG. 4. The injector 214 generally includes a central injection port 220, two outer injection ports 222, and separation ports 224 positioned between the central ports 220 and each of the outer ports 222 and exhaust ports 218. In accordance with this invention, the central injection port 220 is coupled to an ozone source 226, the outer ports 222 are coupled to a chemical reagent source 228, and the separation ports 224 are coupled to a source 230 of an inert gas such as nitrogen to prevent premature mixing of the reagent and ozone which could lead to powder formation. The chemical reagent is tetraethoxysilane (TEOS). In the illustrated embodiment, the TEOS vapor is delivered to the outer ports 222 from a bubbler at 65° C. by nitrogen carrier gas. However, other means may be used to deliver the chemical reagent to the outer ports 222 as is known in the art.

Ozone may be injected through the central port 220 at a flow rate of about 2 to 10 standard liter per minute (slm). The ozone is preferably supplied in a mixture of ozone and oxygen having an ozone concentration of about 70 to 150 g/m$^3$ ozone. The chemical reagent or TEOS can be supplied at a flow rate of 10 to 50 standard cubic centimeters per minute (sccm), and injected through the outer ports with a nitrogen carrier gas at a flow rate of about 0.5 to 8 slm. The ratio of ozone to TEOS introduced into the chamber is in the range of 10:1 to 30:1. The injected gases mix and react to deposit a film on the surface of the wafer 26.

Figure 5:
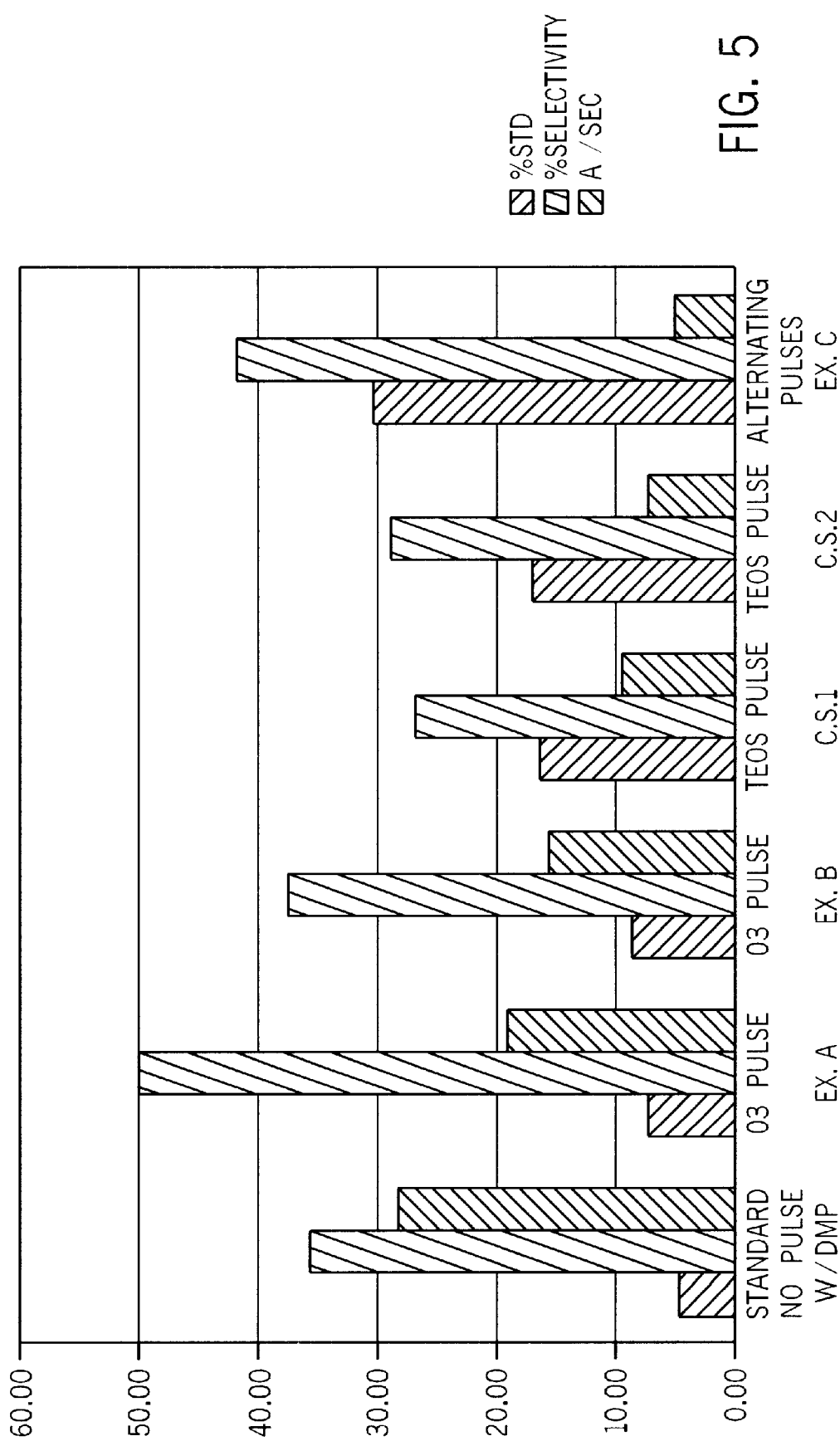
FIG. 5 is a bar graph comparing uniformity, selectivity and deposition rate for a pulsed reactant process.

Examples of the enhanced selectivity obtained by the current invention are shown in FIG. 5 for substrates of silicon and SiN. FIG. 5 shows the selectivity, standard deviation and deposition rate for various pulsing options and film thickness. Selectivity is the preferred deposition on silicon versus SiN and is defined as:

Selectivity=$(T_{si}/T_{siN}-1) \times 100\%$, where $T_{si}$ is the oxide film thickness deposited onto a silicon substrate and $T_{SiN}$ is the oxide film thickness deposited onto a SiN substrate.

The examples shown in FIG. 5 were produced using a showerhead design injector to deliver 350 milligrams per minute TEOS and about five liters per minute of oxygen containing about 10% by weight ozone. Pulsing was done at 1 second intervals for pulsed TEOS delivery and pulsed ozone delivery. Pulsing was done at 2 second intervals for alternating TEOS and ozone delivery. The reaction temperature was about 400° C. The reaction pressure was about 500 torr. The reaction times were varied as necessary to obtain the desired thickness of the deposited layer, but were generally about 10–30 seconds. The spacing between the showerhead and the substrate was 150 mm for the standard no-pulse, Examples (Ex.) A and C, and Comparative Sample (C.S.) 1. The spacing between the showerhead and the substrate was 200 mm for Example B and C.S. 2.

As shown in FIG. 5, pulsing the delivery of ozone (Ex. A) improved the selectivity of oxide deposition by 28% over the standard no-pulse conditions 50% selectivity vs. 35% selectivity, respectively). Cross wafer uniformity suffers in this regime using a showerhead gas dispersion system. However, the cross wafer uniformity would not be an issue when using a linear injector due to the ability of a linear injector to distribute the reactant gases uniformly. The selectivity effect is muted at higher film thickness, as should be expected because the substrate is effectively masked from the reactants as the oxide layer builds up. Comparing Ex. A and Ex. B, the selectivity and standard deviation are better with a tighter showerhead/substrate spacing. Alternating, mutually exclusive pulses of TEOS and ozone (Ex. C) result in a much lower deposition rate but an at least 14% higher selectivity compared to the no pulse process (43% vs. 35%, respectively). Again, the alternating pulses result in a decrease in cross wafer uniformity but use of a linear injector is expected to provide acceptable uniformity.

C.S. 1 and C.S. 2 demonstrate that both selectivity and uniformity are worse than standard no pulse conditions when only the TEOS is pulsed.

The methods and devices of the current invention are useful whenever semiconductors are fabricated with silicon-comprising regions or structures having different type conductivities. Examples of useful applications include memory arrays, such as DRAM and static random access memory (SRAM), logic circuitry, and combinations of memory and logic, such as a system-on-chip array.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method for selectively depositing silicon oxide onto a substrate, the method comprising the steps of:

providing a substrate having at least one exposed region of silicon and at least one exposed region of silicon nitride and/or comprising at least one exposed silicon region of one type of conductivity and at least one exposed silicon region of a different type conductivity;

delivering, via a linear injector, ozone and tetraethylorthosilicate into contact with the substrate and with each other, wherein the delivery of the ozone is pulsed on and off; and reacting the ozone and tetraethylorthosilicate in contact with the substrate to selectively deposit silicon oxide onto the substrate.

2. The method of claim 1, wherein the ozone is pulsed for 1–4 second intervals.

3. The method of claim 1, wherein the ozone is pulsed for 1 second intervals.

4. A method for selectively depositing silicon oxide onto a substrate, the method comprising the steps of:

providing a substrate having at least one exposed region of silicon and at least one exposed region of silicon nitride and/or comprising at least one exposed silicon region of one type of conductivity and at least one exposed silicon region of a different type conductivity;

delivering, via a linear injector, ozone and tetraethylorthosilicate into contact with the substrate and with each other, wherein the delivery of the ozone is pulsed on and off; and reacting the ozone and tetraethylorthosilicate in contact with the substrate to selectively deposit silicon oxide onto the substrate,
wherein the reaction occurs at a temperature up to about 500° C. and a pressure of at least about 10 torr.

5. The method of claim 4, wherein the reaction occurs at a temperature up to about 400° C.

6. The method of claim 4, wherein the reaction occurs at a pressure of at least about 300 torr.

7. The method of claim 4, wherein the ozone is pulsed at intervals between 1–4 seconds.

8. The method of claim 4, wherein the ozone is pulsed at intervals of about 1 second.

9. A method for selectively depositing silicon oxide onto a substrate, the method comprising the steps of:
providing a substrate having at least one exposed region of silicon and at least one exposed region of silicon nitride and/or comprising at least one exposed silicon region of one type of conductivity and at least one exposed silicon region of a different type conductivity;
delivering, via a linear injector, ozone and tetraethylorthosilicate into contact with the substrate and with each other, wherein the delivery of the ozone and the delivery of the tetraethylorthosilicate are pulsed on and off alternately; and
reacting the ozone and tetraethylorthosilicate in contact with the substrate to selectively deposit silicon oxide onto the substrate.

10. The method of claim 9, wherein the alternate pulse durations are between about 1 to about 4 seconds.

11. The method of claim 9, wherein the alternate pulse durations are about 2 seconds.

12. A method for selectively depositing silicon oxide onto a substrate, the method comprising the steps of:
providing a substrate having at least one exposed region of silicon and at least one exposed region of silicon nitride and/or comprising at least one exposed silicon region of one type of conductivity and at least one exposed silicon region of a different type conductivity;
delivering, via a linear injector, ozone and tetraethylorthosilicate into contact with the substrate and with each other, wherein the delivery of the ozone and the delivery of the tetraethylorthosilicate are pulsed on and off alternately; and
reacting the ozone and tetraethylorthosilicate in contact with the substrate to selectively deposit silicon oxide onto the substrate,
wherein the reaction occurs at a temperature up to about 500° C. and a pressure of at least about 10 torr.

13. The method of claim 12, wherein the reaction occurs at a temperature up to about 400° C.

14. The method of claim 12, wherein the reaction occurs at a pressure of at least about 300 torr.

15. The method of claim 12, wherein the alternate pulse duration is between about 1 to about 4 seconds.

16. The method of claim 12, wherein the alternate pulse duration is about 2 seconds.

17. A semiconductor processing method of forming spacers of variable thickness, the method comprising the steps of:
providing a silicon-comprising substrate having a surface comprising at least one first conductive region comprising either P-type silicon or non-doped silicon and at least one second conductive region, provided that:
(1) when the first conductive region comprises P-type silicon, then the second conductive region comprises either non-doped silicon or N-type silicon; and,
(2) when the first conductive region comprises non-doped silicon, then the second conductive region comprises N-type silicon;
decomposing tetraethylorthosilicate with ozone to selectively deposit silicon oxide over the silicon surface and over both the first conductive region and the second conductive region, wherein delivery of the ozone is pulsed on and off whereby a greater thickness of silicon oxide is deposited on the first conductive region than on the second conductive region and delivery of the ozone and the tetraethylorthosilicate is via a linear injector; and,
etching the silicon oxide deposited on the substrate to remove silicon oxide from the surface of the substrate, whereby the silicon oxide layers remaining on the first and second conductive regions provides a layer of variable thickness around the first conductive region and the second conductive region.

18. The method of claim 17, wherein the pulse duration is between about 1 to about 4 seconds.

19. The method of claim 17, wherein the pulse duration is about 1 second.

20. A semiconductor processing method of forming spacers of variable thickness, the process comprising the steps of:
providing a silicon-comprising substrate having a surface comprising at least one first conductive region comprising either P-type silicon or non-doped silicon and at least one second conductive region, provided that:
(1) when the first conductive region comprises P-type silicon, then the second conductive region comprises either non-doped silicon or N-type silicon; and,
(2) when the first conductive region comprises non-doped silicon, then the second conductive region comprises N-type silicon;
contacting silicon-comprising substrate with ozone and tetraethylorthosilicate wherein delivery of the ozone is pulsed on and off whereby the first conductive region and the second conductive region are in intimate contact with the ozone and the tetraethylorthosilicate and delivery of the ozone and the tetraethylorthosilicate is via a linear injector;
reacting the ozone and the tetraethylorthosilicate at a temperature up to about 500° C. and a pressure of at least about 10 torr to selectively deposit silicon oxide over the substrate surface and both the first conductive region and the second conductive region, whereby a greater thickness of silicon oxide is deposited on the first conductive region than on the second conductive region; and,
etching the silicon oxide deposited on the substrate to remove silicon oxide from the surface of the substrate, whereby the silicon oxide layers remaining on the first and second conductive regions provides a layer of variable thickness around the first conductive region and the second conductive region.

21. The method of claim 20, wherein the reaction occurs at a temperature up to about 400° C.

22. The method of claim 20, wherein the reaction occurs at a pressure of at least about 300 torr.

23. The method of claim 20, wherein the pulse duration is between 1–4 seconds.

24. The method of claim 20, wherein the pulse duration is about 1 second.

25. A semiconductor processing method of forming spacers of variable thickness, the method comprising the steps of:

providing a silicon-comprising substrate having a surface comprising at least one first protrusion comprising either P-type silicon or non-doped silicon and at least one second protrusion, provided that:
  (1) when the first protrusion comprises P-type silicon then the second protrusion comprises either non-doped silicon or N-type silicon; and,
  (2) when the first protrusion comprises non-doped silicon then the second protrusion comprises N-type silicon;

contacting the wafer surface with ozone and tetraethylorthosilicate wherein delivery of the ozone is pulsed on and off, and delivery of the ozone and the tetraethylorthosilicate is via a linear injector, whereby the first protrusion and the second protrusion are in intimate contact with the ozone and the tetraethylorthosilicate;

decomposing the tetraethylorthosilicate with the ozone to selectively deposit silicon oxide over the wafer surface and both the first protrusion and the second protrusion, whereby a greater thickness of silicon oxide is deposited on the first protrusion than on the second protrusion; and, etching the silicon oxide deposited on the substrate to remove silicon oxide from the surface of the substrate, whereby the silicon oxide layers remaining on the first and second protrusions provides a layer of variable thickness around the first protrusion and the second protrusion.

26. A semiconductor processing method of forming spacers of variable thickness, the process comprising the steps of:

providing a silicon-comprising substrate having a surface comprising at least one first protrusion comprising either P-type silicon or non-doped silicon and at least one second protrusion, provided that:
  (1) when the first protrusion comprises P-type silicon, then the second protrusion comprises either non-doped silicon or N-type silicon; and,
  (2) when the first protrusion comprises non-doped silicon, then the second protrusion comprises N-type silicon;

reacting ozone and TEOS at a temperature up to about 500° C. and a pressure of at least about 10 torr wherein delivery of the ozone is pulsed on and off, and delivery of the ozone and the tetraethylorthosilicate is via a linear injector, to selectively deposit silicon oxide over the wafer surface and both the first protrusion and the second protrusion, whereby a greater thickness of silicon oxide is deposited on the first protrusion than on the second protrusion; and, etching the silicon oxide deposited on the substrate to remove silicon oxide from the surface of the substrate, whereby the silicon oxide layers remaining on the first and second protrusions provides a layer of variable thickness around the first protrusion and the second protrusion.

27. The method of claim 26, wherein the reaction occurs at a temperature up to about 400° C.

28. The method of claim 26, wherein the reaction occurs at a pressure of at least about 300 torr.

29. The method of claim 26, wherein the pulse duration is between 1–4 seconds.

30. The method of claim 26, wherein the pulse duration is about 1 second.

31. A semiconductor processing method of forming wordlines with spacers of variable thickness, the process comprising the steps of:

providing a silicon comprising substrate having a surface comprising at least one first wordline comprising P-type silicon and at least one second wordline comprising N-type silicon, the first and second wordlines being separated on the substrate;

contacting the substrate with ozone and tetraethylorthosilicate wherein delivery of the ozone is pulsed on and off, and delivery of the ozone and the tetraethylorthosilicate is via a linear injector, whereby the first wordline and the second wordline are in intimate contact with the ozone and the tetraethylorthosilicate;

reacting the ozone and the tetraethylorthosilicate to selectively deposit silicon oxide over the substrate surface and both the first wordline and the second wordline, whereby a greater thickness of silicon oxide is deposited on the first wordline than on the second wordline; and, etching the silicon oxide deposited on the substrate to remove silicon oxide from the surface of the substrate, whereby the silicon oxide layers remaining on the first and second wordlines provides a layer of variable thickness around the first wordline and the second wordline.

32. A semiconductor processing method of forming wordlines with spacers of variable thickness, the process comprising the steps of:

providing a silicon-comprising substrate having a surface comprising at least one first wordline comprising P-type silicon and at least one second wordline comprising N-type silicon:

reacting ozone and tetraethylorthosilicate at a temperature up to about 500° C. and a pressure of at least about 10 torr wherein delivery of the ozone is pulsed on and off, and the ozone and the tetraethylorthosilicate are delivered via a linear injector, to selectively deposit silicon oxide over the wafer surface and both the first wordline and the second wordline, whereby a greater thickness of silicon oxide is deposited on the first wordline than on the second wordline; and, etching the silicon oxide deposited on the substrate to remove silicon oxide from the surface of the substrate, whereby the silicon oxide layers remaining on the first and second wordlines provides a layer of variable thickness around the first wordline and the second wordline.

33. The method of claim 32, wherein the reaction occurs at a temperature up to about 400° C.

34. The method of claim 32, wherein the reaction occurs at a pressure of at least about 300 torr.

35. The method of claim 32, wherein the ozone is pulsed at intervals between 1–4 seconds.

36. The method of claim 32, wherein the ozone is pulsed at intervals of about 1 second.

37. A semiconductor processing method of forming spacers of variable thickness, the method comprising the steps of:

providing a silicon-comprising substrate having a surface comprising at least one first conductive region comprising either P-type silicon or non-doped silicon and at least one second conductive region, provided that:
  (1) when the first conductive region comprises P-type silicon, then the second conductive region comprises either non-doped silicon or N-type silicon; and,
  (2) when the first conductive region comprises non-doped silicon, then the second conductive region comprises N-type silicon;

decomposing tetraethylorthosilicate with ozone to selectively deposit silicon oxide over the silicon surface and over both the first conductive region and the second conductive region, wherein delivery of the ozone and the tetraethylorthosilicate are alternately pulsed on and off, whereby a greater thickness of silicon oxide is deposited on the first conductive region than on the second conductive region and delivery of the ozone and the tetraethylorthosilicate is via a linear injector; and, etching the silicon oxide deposited on the substrate to remove silicon oxide from the surface of the substrate, whereby the silicon oxide layers remaining on the first and second conductive regions provides a layer of variable thickness around the first conductive region and the second conductive region.

38. The method of claim 37, wherein the pulse duration is between about 1 to about 4 seconds.

39. The method of claim 37, wherein the pulse duration is about 2 seconds.

40. A semiconductor processing method of forming spacers of variable thickness, the process comprising the steps of:

providing a silicon-comprising substrate having a surface comprising at least one first conductive region comprising either P-type silicon or non-doped silicon and at least one second conductive region, provided that:
  (1) when the first conductive region comprises P-type silicon, then the second conductive region comprises either non-doped silicon or N-type silicon; and,
  (2) when the first conductive region comprises non-doped silicon, then the second conductive region comprises N-type silicon;

contacting silicon-comprising substrate with ozone and tetraethylorthosilicate wherein the ozone delivery and the tetraethylorthosilicate are alternately pulsed on and off whereby the first conductive region and the second conductive region are in intimate contact with the ozone and the tetraethylorthosilicate and the delivery of the ozone and the tetraethylorthosilicate is via a linear injector;

reacting the ozone and the tetraethylorthosilicate at a temperature up to about 500° C. and a pressure of at least about 10 torr to selectively deposit silicon oxide over the substrate surface and both the first conductive region and the second conductive region, whereby a greater thickness of silicon oxide is deposited on the first conductive region than on the second conductive region; and, etching the silicon oxide deposited on the substrate to remove silicon oxide from the surface of the substrate, whereby the silicon oxide layers remaining on the first and second conductive regions provides a layer of variable thickness around the first conductive region and the second conductive region.

41. The method of claim 40, wherein the reaction occurs at a temperature up to about 400° C.

42. The method of claim 40, wherein the reaction occurs at a pressure of at least about 300 torr.

43. The method of claim 40, wherein the pulse duration is between 1–4 seconds.

44. The method of claim 40, wherein the pulse duration is about 2 seconds.

45. A semiconductor processing method of forming spacers of variable thickness, the method comprising the steps of:

providing a silicon-comprising substrate having a surface comprising at least one first protrusion comprising either P-type silicon or non-doped silicon and at least one second protrusion, provided that:
  (1) when the first protrusion comprises P-type silicon then the second protrusion comprises either non-doped silicon or N-type silicon; and,
  (2) when the first protrusion comprises non-doped silicon then the second protrusion comprises N-type silicon;

contacting the wafer surface with ozone and tetraethylorthosilicate wherein delivery of the ozone and the tetraethylorthosilicate are alternately pulsed on and off, and the delivery of the ozone and the tetraethylorthosilicate is via a linear injector, whereby the first protrusion and the second protrusion are in intimate contact with the ozone and the tetraethylorthosilicate;

decomposing the tetraethylorthosilicate with the ozone to selectively deposit silicon oxide over the wafer surface and both the first protrusion and the second protrusion, whereby a greater thickness of silicon oxide is deposited on the first protrusion than on the second protrusion; and, etching the silicon oxide deposited on the substrate to remove silicon oxide from the surface of the substrate, whereby the silicon oxide layers remaining on the first and second protrusions provides a layer of variable thickness around the first protrusion and the second protrusion.

46. A semiconductor processing method of forming spacers of variable thickness, the process comprising the steps of:

providing a silicon-comprising substrate having a surface comprising at least one first protrusion comprising either P-type silicon or non-doped silicon and at least one second protrusion, provided that:
  (1) when the first protrusion comprises P-type silicon, then the second protrusion comprises either non-doped silicon or N-type silicon; and,
  (2) when the first protrusion comprises non-doped silicon, then the second protrusion comprises N-type silicon;

reacting ozone and TEOS at a temperature up to about 500° C. and a pressure of at least about 10 torr wherein delivery of the ozone and the tetraethylorthosilicate are alternately pulsed on and off, and delivery of the ozone and the tetraethylorthosilicate is via a linear injector, to selectively deposit silicon oxide over the wafer surface and both the first protrusion and the second protrusion, whereby a greater thickness of silicon oxide is deposited on the first protrusion than on the second protrusion; and, etching the silicon oxide deposited on the substrate to remove silicon oxide from the surface of the substrate, whereby the silicon oxide layers remaining on the first and second protrusions provides a layer of variable thickness around the first protrusion and the second protrusion.

47. The method of claim 46, wherein the reaction occurs at a temperature up to about 400° C.

48. The method of claim 46, wherein the reaction occurs at a pressure of at least about 300 torr.

49. The method of claim 46, wherein the pulse duration is between 1–4 seconds.

50. The method of claim 46, wherein the pulse duration is about 2 seconds.

51. A semiconductor processing method of forming wordlines with spacers of variable thickness, the process comprising the steps of:

providing a silicon comprising substrate having a surface comprising at least one first wordline comprising P-type silicon and at least one second wordline comprising N-type silicon, the first and second wordlines being separated on the substrate;

contacting the substrate with ozone and tetraethylorthosilicate wherein delivery of the ozone and the tetraethylorthosilicate are alternately pulsed on and off, and delivery of the ozone and the tetraethylorthosilicate is via a linear injector, whereby the first wordline and the second wordline are in intimate contact with the ozone and the tetraethylorthosilicate;

reacting the ozone and the tetraethylorthosilicate to selectively deposit silicon oxide over the substrate surface and both the first wordline and the second wordline, whereby a greater thickness of silicon oxide is deposited on the first wordline than on the second wordline; and, etching the silicon oxide deposited on the substrate to remove silicon oxide from the surface of the substrate, whereby the silicon oxide layers remaining on the first and second wordlines provides a layer of variable thickness around the first wordline and the second wordline.

52. A semiconductor processing method of forming wordlines with spacers of variable thickness, the process comprising the steps of:

providing a silicon-comprising substrate having a surface comprising at least one first wordline comprising P-type silicon and at least one second wordline comprising N-type silicon:

reacting ozone and tetraethylorthosilicate at a temperature up to about 500° C. and a pressure of at least about 10 torr wherein delivery of the ozone and the tetraethylorthosilicate are alternately pulsed on and off, and the ozone and the tetraethylorthosilicate are delivered via a linear injector, to selectively deposit silicon oxide over the wafer surface and both the first wordline and the second wordline, whereby a greater thickness of silicon oxide is deposited on the first wordline than on the second wordline; and, etching the silicon oxide deposited on the substrate to remove silicon oxide from the surface of the substrate, whereby the silicon oxide layers remaining on the first and second wordlines provides a layer of variable thickness around the first wordline and the second wordline.

53. The method of claim 52, wherein the reaction occurs at a temperature up to about 400° C.

54. The method of claim 52, wherein the reaction occurs at a pressure of at least about 300 torr.

55. The method of claim 52, wherein the ozone is pulsed at intervals between 1–4 seconds.

56. The method of claim 52, wherein the ozone is pulsed at intervals of about 2 seconds.

* * * * *

UNITED STATES PATENT AND TRADEMARK OFFICE
CERTIFICATE OF CORRECTION

PATENT NO. : 6,503,851 B2
DATED : January 7, 2003
INVENTOR(S) : William Budge et al.

It is certified that error appears in the above-identified patent and that said Letters Patent is hereby corrected as shown below:

Column 7,
Line 41, replace "24" with -- 28 --.

Signed and Sealed this

Twenty-second Day of July, 2003

JAMES E. ROGAN
*Director of the United States Patent and Trademark Office*